(12) United States Patent
Song et al.

(10) Patent No.: US 6,861,861 B2
(45) Date of Patent: Mar. 1, 2005

(54) DEVICE FOR COMPENSATING FOR A TEST TEMPERATURE DEVIATION IN A SEMICONDUCTOR DEVICE HANDLER

(75) Inventors: Jae Myeong Song, Kyonggi-do (KR); Chul Ho Ham, Kyonggi-do (KR); Chan Ho Park, Chungchongnam-do (KR); Eui Sung Hwang, Seoul (KR); Woo Young Lim, Seoul (KR); Jae Bong Seo, Kyonggi-do (KR); Eung Yong Lee, Kyonggi-do (KR); Byeng Gi Lee, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 80 days.

(21) Appl. No.: 10/366,368

(22) Filed: Feb. 14, 2003

(65) Prior Publication Data

US 2004/0017185 A1 Jan. 29, 2004

(30) Foreign Application Priority Data

Jul. 24, 2002 (KR) .............................. P10-2002-0043679
Jul. 24, 2002 (KR) .............................. P10-2002-0043680
Jul. 24, 2002 (KR) .............................. P10-2002-0043678

(51) Int. Cl.$^7$ .............................................. G01R 31/02
(52) U.S. Cl. ...................... 324/760; 324/158.1; 324/765
(58) Field of Search .............................. 324/158.1, 760, 324/765; 165/80.3, 80.5; 438/14–18; 361/679, 688, 689, 690, 694, 698; 414/416, 422, 783

(56) References Cited

U.S. PATENT DOCUMENTS 3,710,251 A * 1/1973 Hagge et al. ................ 324/760
3,979,671 A * 9/1976 Meeker et al. ............... 324/760
4,787,752 A * 11/1988 Fraser et al. .................. 374/45
5,909,657 A * 6/1999 Onishi et al. ................ 702/108
6,104,183 A * 8/2000 Kobayashi et al. ....... 324/158.1
6,384,593 B1 * 5/2002 Kobayashi et al. ....... 324/158.1

* cited by examiner

*Primary Examiner*—Vinh P. Nguyen
(74) *Attorney, Agent, or Firm*—Fleshner & Film, LLP

(57) ABSTRACT

A semiconductor device handler is provided, in which a test temperature deviation of a semiconductor device caused by heat produced by the semiconductor device itself during testing is compensated for, allowing a test of the semiconductor device to be carried out at an exact temperature, or within an exact temperature range. The semiconductor device handler includes at least one enclosed chamber, a heating/cooling apparatus configured to bring an inside of the at least one chamber to a low or high temperature state, a pushing unit provided within the at least one chamber and configured to push a plurality of semiconductor devices mounted on a test tray into test sockets of a test board located within the at least one chamber for testing, a cooling fluid supplying apparatus configured to supply cooling fluid, a nozzle assembly configured to spray cooling fluid received from the cooling fluid supplying apparatus onto the semiconductor devices fitted to the test sockets, and a control unit configured to control spraying of cooling fluid onto the semiconductor devices during testing to compensate for temperature changes of the semiconductor devices that occur during testing.

28 Claims, 10 Drawing Sheets

DEVICE FOR COMPENSATING FOR A TEST TEMPERATURE DEVIATION IN A SEMICONDUCTOR DEVICE HANDLER

BACKGROUND OF THE INVENTION

1. Field of the Invention

The invention relates to a handler for use in testing semiconductor devices, and more particularly, to a device for compensating for a test temperature deviation in a semiconductor device handler.

2. Background of the Related Art

In general, memory, or non-memory semiconductor devices, or modules each having memory, and/or non-memory semiconductor devices arranged on a substrate to form a circuit, are subjected to various tests after fabrication before shipment. The semiconductor device handler (hereafter referred to as "handler") is an apparatus for automatic transportation of the semiconductor devices or the modules during testing. The handler carries out a process in which, when a loading stacker receives trays having the semiconductor devices or modules held therein, a picker robot transports the semiconductor devices or modules to be tested to a test site, fits them into test sockets, carries out required tests, transports the tested semiconductor devices or modules to an unloading stacker, and unloads the semiconductor devices or modules on designated trays according to a result of the test in order to classify the semiconductor devices or the modules.

In general, many handlers have a system for carrying out, not only general performance tests at room temperature, but also tests at high or low temperatures in which an extreme high or low temperature environment is formed by providing an electric heater, or a liquefied gas spray system, within an enclosed chamber. The semiconductor devices or modules are tested to determine if the semiconductor devices or modules can carry out regular performance under the extreme temperature condition.

However, in carrying out a test using a handler which facilitates the temperature test of the semiconductor device, the semiconductor device itself generates heat during the time the semiconductor device electrically connected to the test socket is tested. This added heat impedes conducting a test at an exact preset temperature. This is a problem that must be solved for both test and actual application environments as the semiconductor devices become smaller and packing density increases.

For example, in a high temperature test, if a user sets a temperature of an inside of the chamber to 80° C. for the test, if there is no heat generated by the semiconductor device itself, the test can be carried out at the set temperature of 80° C. However, if heat is generated by the semiconductor device during the test, causing a test temperature deviation of approx. 15° C. results, the test is carried out at 95° C. instead of at the desired temperature of 80° C.

Accordingly, the test of the semiconductor device is carried out at a temperature higher than the set temperature. This results in a drop in yield and reliability as the test at the desired exact temperature or within the desired temperature range failed.

SUMMARY OF THE INVENTION

An object of the invention is to solve at least the above problems and/or disadvantages and to provide at least the advantages described hereinafter.

Accordingly, the invention is directed to a device for compensating for a test temperature deviation in a handler that substantially obviates one or more of the problems due to limitations and disadvantages of the related art.

To achieve these and other advantages and in accordance with the purpose of the present invention, as embodied and broadly described, a semiconductor device handler is provided which includes at least one enclosed chamber, a heating/cooling apparatus configured to bring an inside of the at least one chamber to a low or high temperature state, a pushing unit provided within the at least one chamber and configured to push a plurality of semiconductor devices mounted on a test tray into test sockets of a test board located within the at least one chamber for testing, a cooling fluid supplying apparatus configured to supply cooling fluid, a nozzle assembly configured to spray cooling fluid received from the cooling fluid supplying apparatus onto the semiconductor devices fitted to the test sockets, and a control unit configured to control spraying of cooling fluid onto semiconductor devices during testing to compensate for temperature changes of the semiconductor devices that occur during testing.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Figure 1:
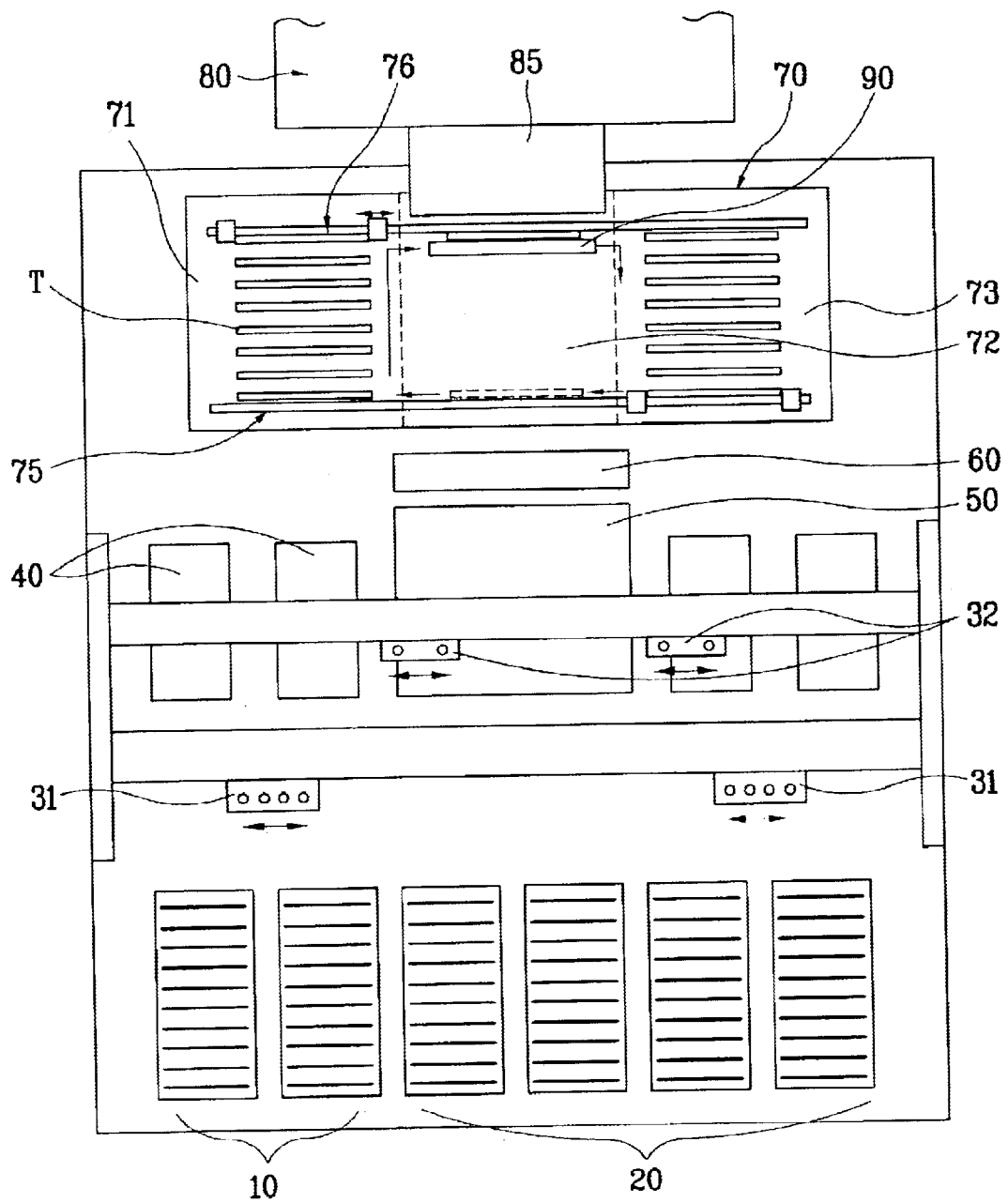
FIG. 1 is a schematic plan view of a handler having a device for compensating a test temperature deviation in accordance with an embodiment of the invention.
Figure 2A:
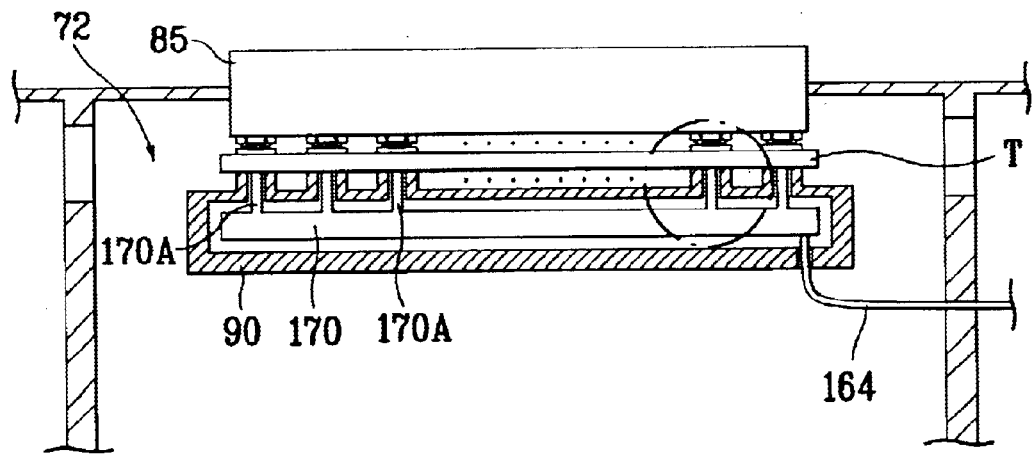
FIGS. 2A and 2B are schematic side sectional views of a test site of the handler of FIG. 1.
Figure 2B:
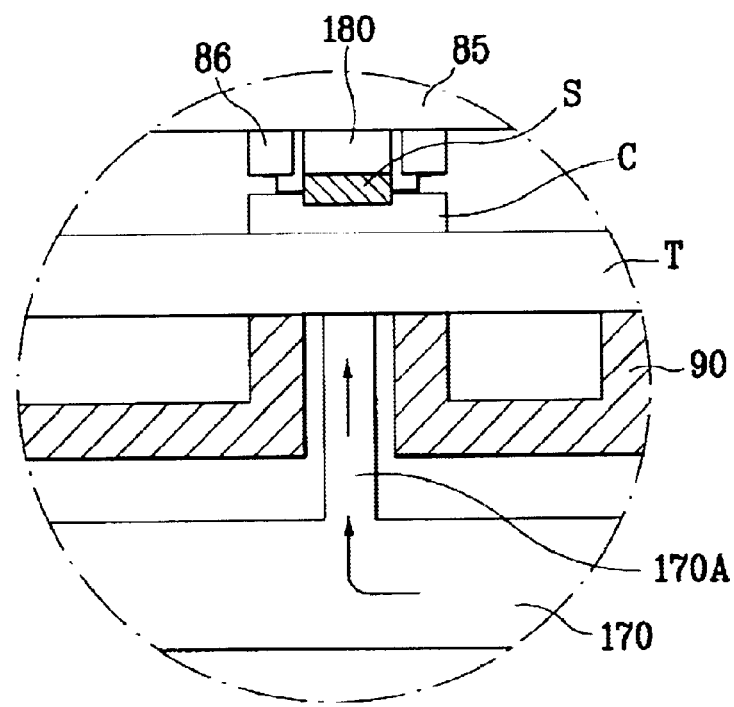

Reference will now be made in detail to the embodiments of the present invention, examples of which are illustrated in the accompanying drawings. FIG. 1 is a schematic plan view of a handler having a device for compensating a test temperature deviation in accordance with the invention. FIGS. 2A and 2B are schematic side sectional views of a test site of the handler of FIG. 1.

The handler and its operation will be explained as follows.

The handler shown in FIG. 1 includes a loading unit 10 in a front portion of the handler 1, in which user trays may be loaded, and an unloading unit 20 to one side of the loading unit 10, in which tested semiconductor devices may be loaded on the user trays, with the tested semiconductor devices classified according to a result of the test(s).

Buffer units 40 are provided on both sides of a middle position of the handler 1. The buffer units 40 temporarily retain the semiconductor devices transported from the loading unit 10. An exchange unit 50 is provided between the buffer units 40. The exchange unit 50 takes the semiconductor devices to be tested from the buffer units 40 and places them in a test tray T. The exchange unit 50 also returns the tested semiconductor devices from the test tray T to the buffer units 40.

One or more first picker robot(s) 31 and second picker robot(s) 32 are provided between the front portion of the handler 1 having the loading unit 10 and the unloading unit 20, and the middle portion of the handler 1 having the exchange unit 50 and the buffer units 40. Each picker unit 31, 32 is linearly movable in the X-Y axes directions and picks up the semiconductor devices. The first picker robot(s) 31 move(s) between the loading unit 10, the unloading unit 20, and the buffer units 40 to transport the semiconductor devices. The second picker robot(s) 32 move(s) between the buffer units 40 and the exchange unit 50 to transport the semiconductor devices.

A chamber unit 70 is provided in a rear portion of the handler 1 and includes sealed chambers. One or more of the chambers may be fitted with an electric heater or a liquefied gas spraying system (not shown) to form a high or low temperature environment for testing semiconductor devices, which are placed within the respective chamber on the tray T and which are then subjected to testing in the respective high or low temperature environment.

In the embodiment of FIG. 1, the chamber 70 includes a pre-heat chamber 71, a test chamber 72, and a defrost chamber 73. In the pre-heat chamber 71, the test trays T transported from the exchange unit 50 are heated or cooled to a preset temperature while being moved step by step from a front portion thereof to a rear portion thereof. In the test chamber 72, the semiconductor device(s) positioned on the test trays T are fitted to test sockets 86 on a test board 85 (called a Hi-Fix) connected to an external test apparatus 80 and are then tested at the preset temperature. In the defrosting chamber 73, which is at one side of the test chamber 72, the tested semiconductor device(s) are restored to an initial room temperature. The pre-heat chamber may heat or cool the test trays T to a preset temperature while moving the test trays through the test chamber 72 step by step from a rear part thereof to a front part thereof.

Figure 3:
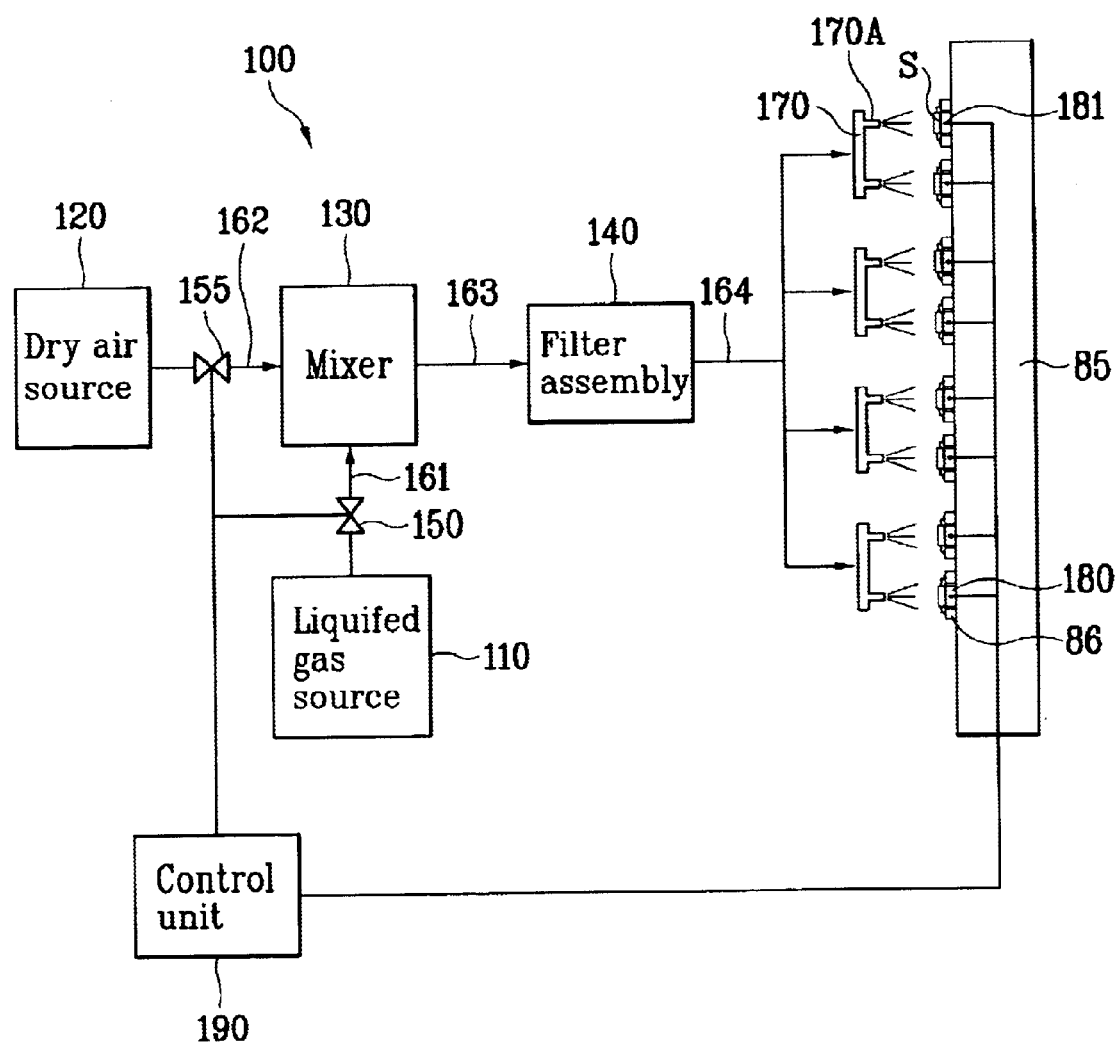
FIG. 3 is a block diagram of a device for compensating for a test temperature deviation in accordance with the invention.

As shown in FIGS. 2A and 2B, a pushing unit 90 is provided in the test chamber 72 for pushing the semiconductor device(s) attached to a carrier C on the test tray T toward the test board 85 for fitting/removing the semiconductor device(s) to/from the test socket 86. The pushing unit 90 includes a nozzle assembly 170 fixed thereto for spraying a cooling fluid mixture of dry air and liquid gas, such as liquid nitrogen. As shown in FIGS. 2A, 2B, and 3, the nozzle assembly 170 includes a plurality of nozzles 170A which may be individually controllable. The cooling fluid compensates for any temperature deviation by cooling the semiconductor device(s) under test.

Moreover, heat sink(s) 180, such as aluminum heat sinks, may be provided adjacent to the test sockets 86 of the test board 85. Alternatively, the heat sinks may be provided on the test tray T. The heat sink(s) 180 are brought into surface to surface contact with the semiconductor device(s) S to cool down the semiconductor device(s), thereby compensating for test temperature deviation together with the nozzle assembly 170.

The heat sink(s) 180 may have a built-in temperature sensor 181. The temperature sensor 181 detects and transmits a temperature to a control unit 190 (see FIG. 3). Alternatively, the temperature sensor may be provided on or in the carrier C, the test tray T, the pushing unit 90, or any other location in which it can sense a temperature, temperature change and/or temperature change rate of a semiconductor device before, during, or after testing. The temperature sensor may also be provided on or as part of the test board 85. In one embodiment, the heat sink(s) 180 each include a heat pipe (not shown) filled with refrigerant for heat dissipation.

FIG. 3 is a schematic diagram of a device for compensating for a test temperature deviation in accordance with an embodiment of the invention. Referring to FIG. 3, the device 100 includes a fluid source 110 that supplies liquid gas, such as liquid nitrogen $LN_2$, a dry air source 120 that supplies dry air, a mixer 130 connected both to the liquefied gas source 110 and the dry air source 120. The mixer 130 mixes the liquefied gas and the dry air uniformly to form a cooling fluid, and supplies the cooling fluid to the nozzle assembly 170.

A first solenoid valve 150 is provided on a flow line connecting the liquid gas source 110 and the mixer 130. The first solenoid valve 150 controls a flow of the liquid gas supplied to the mixer 130. A second solenoid valve 160 is provided on a flow line connecting the dry air source 120 to the mixer 130. The second solenoid valve 160 controls a flow of dry air to the mixer 130. The first and second solenoid valves 150 and 160 are operated by the control unit 190 which electrically controls operation of the handler. The control unit 190 may control spraying of cooling fluid by controlling the spray rate of cooling fluid, a period of time that cooling fluid is sprayed, and/or the proportions of gases in the cooling fluid.

Figure 4:
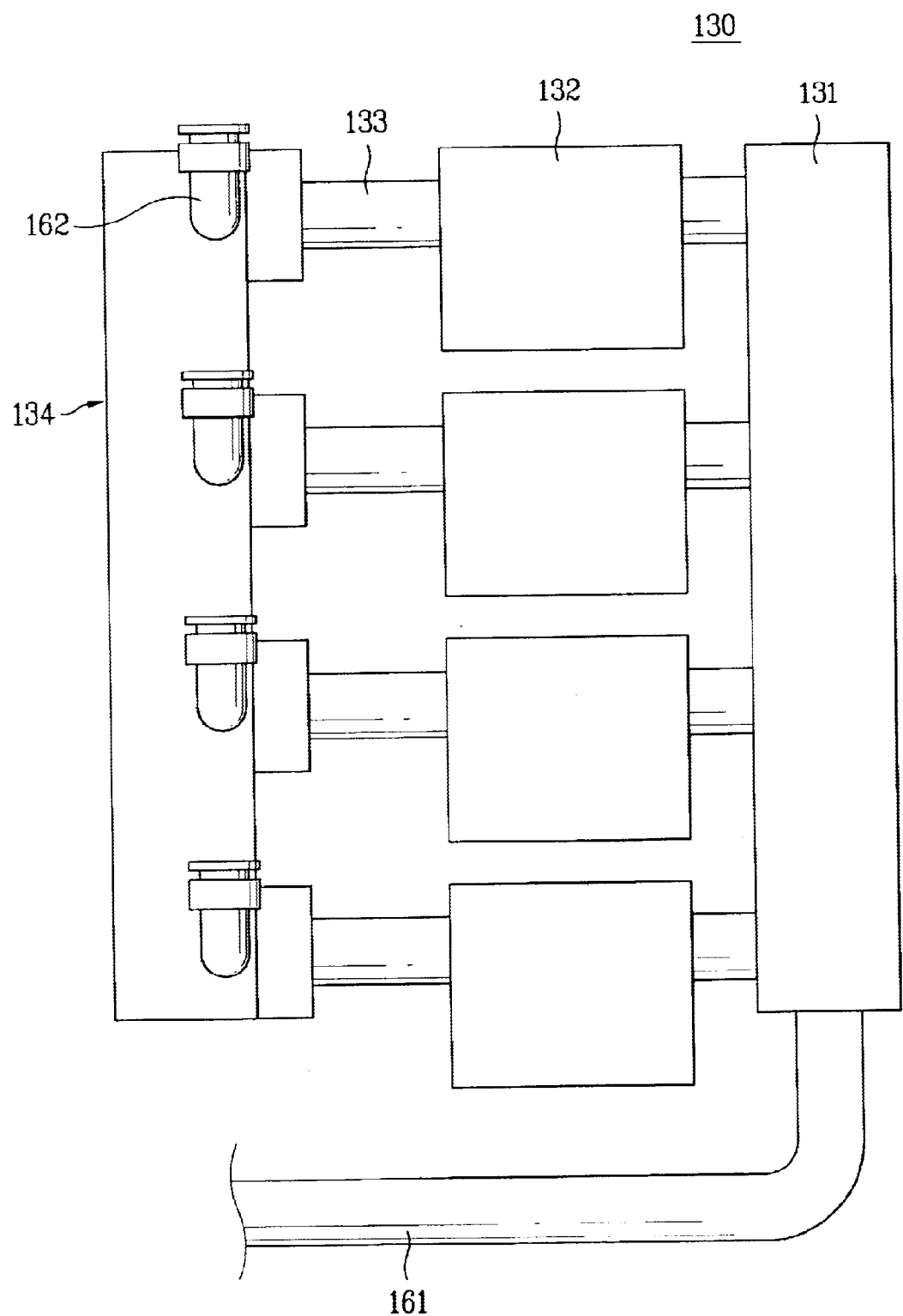
FIG. 4 is a schematic front view of a mixer in a device for compensating for a test temperature deviation in accordance with an embodiment of the invention.
Figure 5:
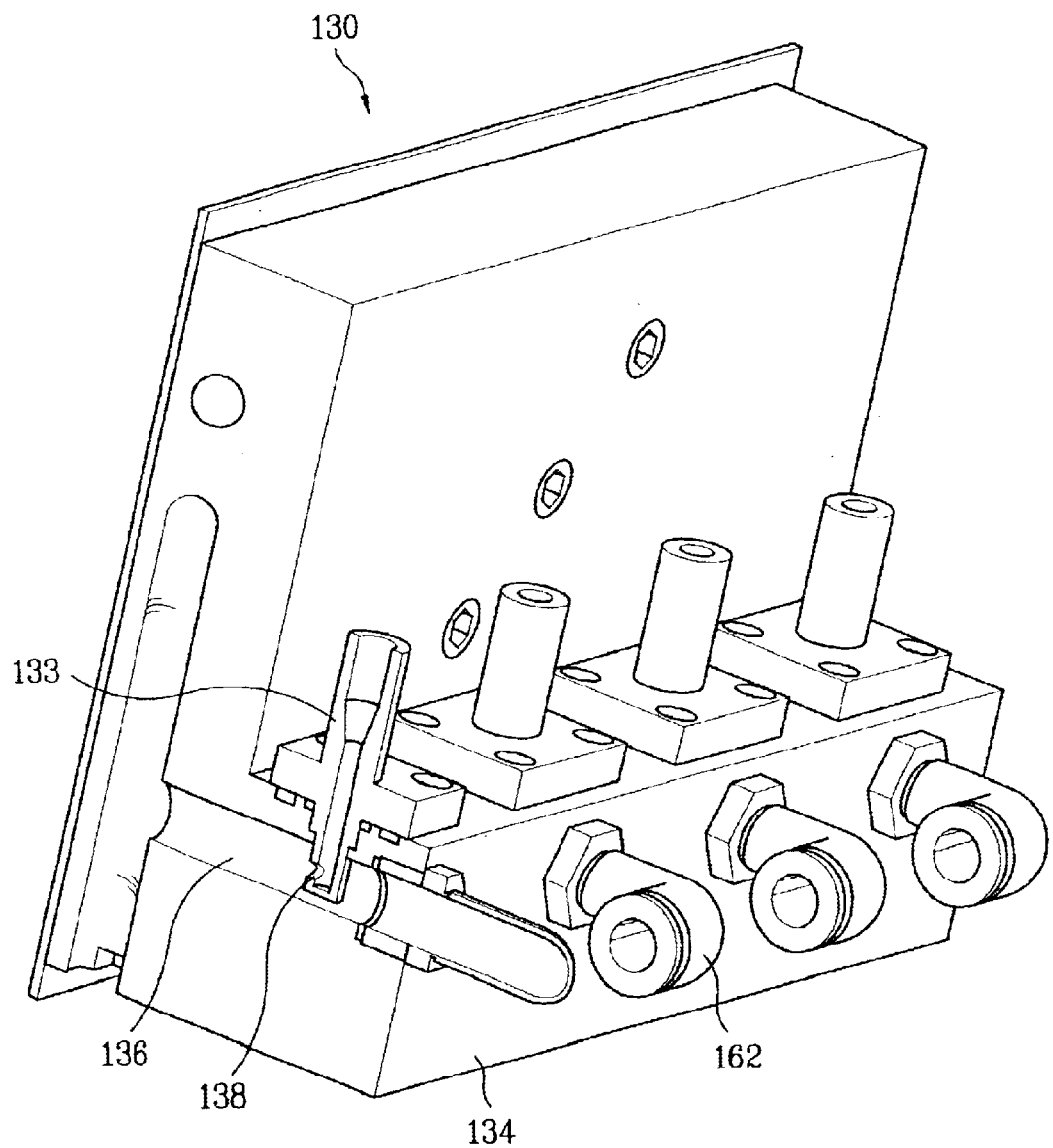
FIG. 5 is a schematic perspective view of the mixer of FIG. 4.
Figure 6:
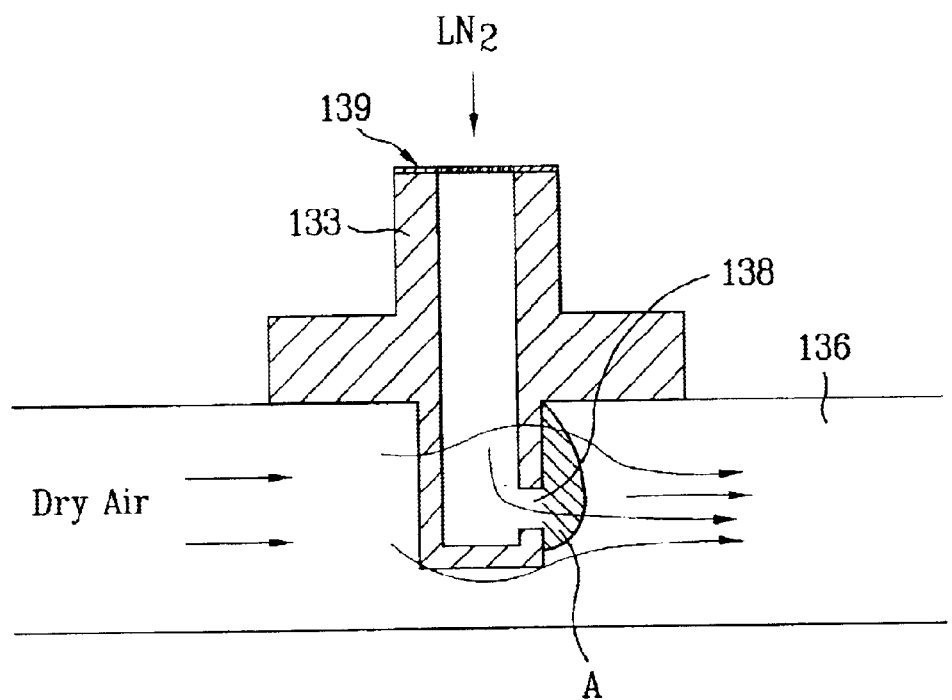
FIG. 6 is a schematic sectional view of the mixer of FIG. 4 explaining operation of the mixer.

Referring to FIGS. 4–6, the mixer 130 includes a liquefied gas distribution header 131 connected to an end of a supply tube 161 connected to the liquefied gas source 110, for receiving a liquefied gas, such as liquefied nitrogen, four solenoid valves 132 and four liquefied gas guide tubes 133, and a mixer body 134 connected to ends of the liquefied gas guide tubes 133. The solenoid valve 132 controls a flow rate of the liquefied gas supplied from the liquefied gas distribution header 131 to the mixer body 134 through the liquefied gas guide tubes 33.

In the exemplary embodiment shown in FIG. 4, there are four dry air supply tubes 162 connected between the dry air source 120 and the mixer body 134. The dry air supply tubes 162 supply dry air to the mixer body 134 through the dry air supply tube 152. There are also four dry air flow passages 136 in the mixer body 134. Each dry air supply passage 136 has an inlet connected to a dry air supply tube 162 for receiving the dry air, and an outlet connected to a cooling fluid supply tube 163 (see FIG. 3) connected to the filter assembly 140 (see FIG. 3). In this embodiment, there are four dry air supply tubes 162 and four dry air supply passages 136. However, in other embodiments, other numbers of dry air supply tubes and dry air supply passages may also be appropriate.

As shown in FIG. 5, the liquefied gas guide tube 133 penetrates one side of the dry air flow passage 136 perpendicular thereto at one side of the mixer body 134 such that an end of the liquefied gas guide tube 133 is positioned within the dry air flow passage 136. A liquefied gas outlet 138 is formed at one end and faces a flow direction of the dry air. The liquefied gas discharge outlet 138 is formed only in the back side of the liquefied gas guide tube 133, and utilizes a pressure drop region A, i.e., a low pressure region, in the back side of the end of the liquefied gas guide tube 133 caused by the dry air flowing through the dry air flow passage 136.

Figure 7:
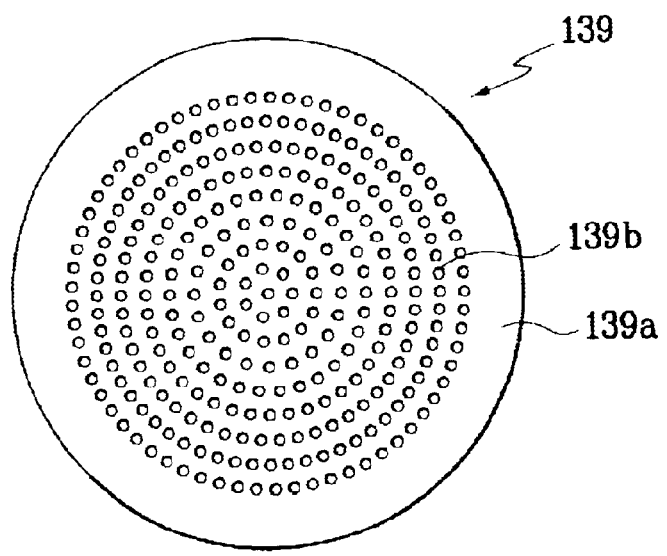
FIG. 7 is a schematic front view of the atomizing member in the mixer of FIG. 4.

An atomizing member 139 is fitted across the liquefied gas guide tube 133. The atomizing member 139 atomizes liquid phase grain of the liquefied gas and includes a plurality of pass through holes 139b forming a circular perforated plate 139a, as shown in FIG. 7.

Figure 8:
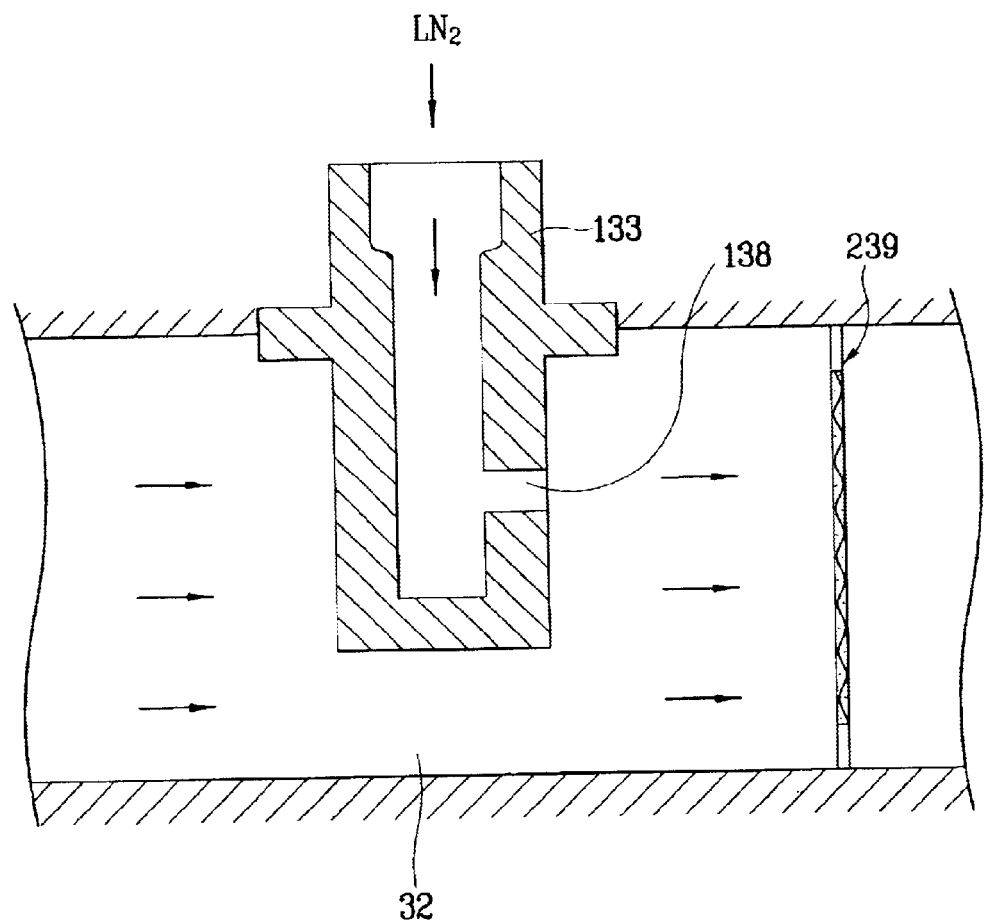
FIG. 8 is a schematic sectional view of a mixer in a device for compensating for a test temperature deviation in accordance with another embodiment of the invention.
Figure 9:
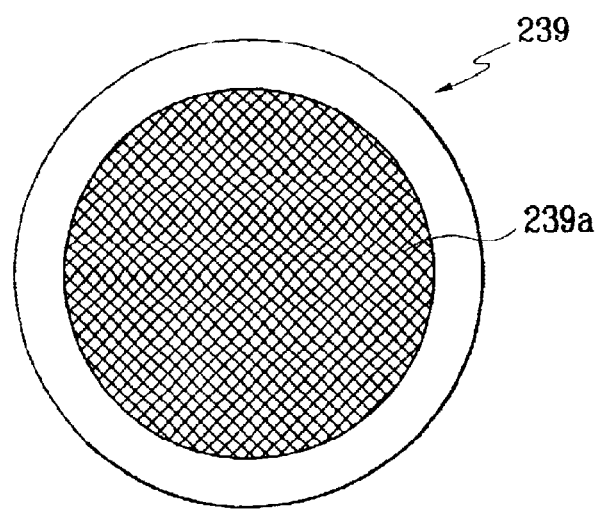
FIG. 9 is a schematic front view of the atomizing member in the mixer of FIG. 8.

The atomizing member may be fitted, not to the liquefied gas guide tube 133, but to the outlet of the dry air flow passage 136. In that case, the atomizing member may be a net 239a, as shown in FIGS. 8 and 9. This configuration assures smooth flow of the cooling fluid, atomizing the liquefied gas.

In the case the atomizing member 139 is fitted, not to the liquefied gas guide tube 133, but to the outlet of the dry air flow passage 136, when a supply pressure of the liquefied gas flowing through the liquefied gas guide tube 133 does not drop, the liquefied gas can flow into the dry air flow passage smoothly, facilitating a more uniform mixing of the liquefied gas with the dry air. In the meantime, the filter assembly 140 atomizes large grains of the liquefied gas that pass through the atomizing member 139 or 239 in the mixer 130, preventing the liquefied gas from being sprayed through the nozzle assembly 170 and stuck to the semiconductor device(s).

Figure 10:
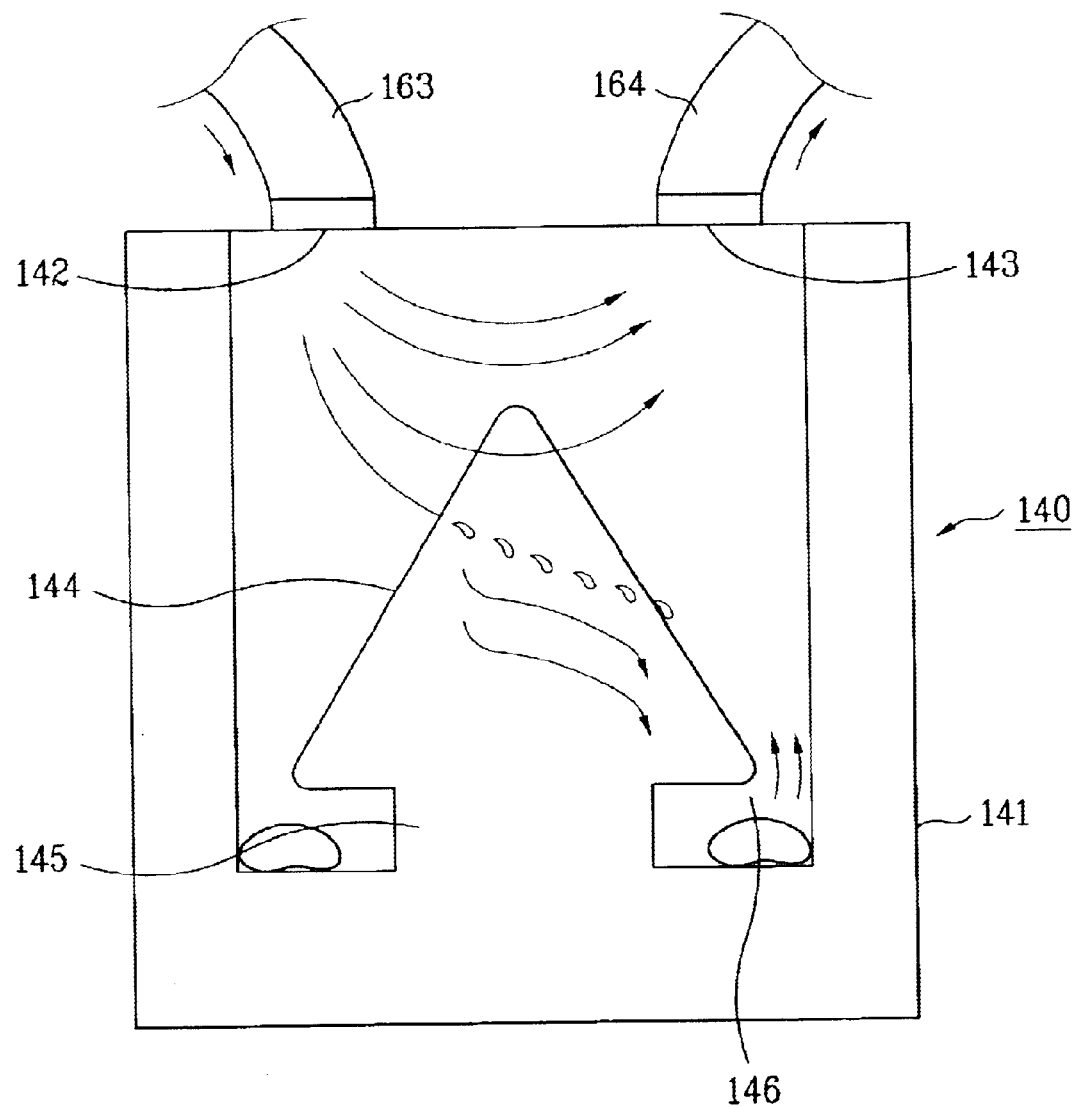
FIG. 10 is a schematic sectional view of a filter assembly in a device for compensating for a test temperature deviation in accordance with an embodiment of the invention.

Referring to FIG. 10, the filter assembly 140 includes a substantially cylindrical housing 141, a cooling fluid inlet 142 and a cooling fluid outlet 143, which are both provided in a top surface of the housing 141 and connected to cooling fluid supply tubes 163 and 164, respectively, and a conical gas-liquid separating member 144 provided with the housing 141.

The gas-liquid separating member 144 is attached to a support part 145 at a central portion of an inside floor of the housing 141, forming a space SP between a bottom portion of the gas-liquid separating member 144 and a floor of the housing 141. The liquefied gas still in a liquid phase falls down along the gas-liquid separating member 144 into the space SP, as shown in FIG. 10.

The operation of a device for compensating for a test temperature deviation according to an embodiment of the invention will be explained as follows.

Upon putting the handler into operation, the inside of the test chamber 72 is brought to a temperature state by the heating/cooling device, such as an electric heater, or a liquefied gas spraying system. Then, when a test tray T having semiconductor device(s) S is transported into the test chamber 72 and is placed between the pushing unit 90 and the test board 85, the pushing unit 90 moves toward the test board 85, pushing the semiconductor device(s) S fitted to the carrier C of the test tray T to the test socket 86, thereby starting the test.

In this instance, the semiconductor device(s) S are brought into surface to surface contact with the heat sink(s) 180 of the test socket 86, and are cooled down. As the semiconductor device test is started, liquefied gas and dry air are supplied from the liquefied gas source 110 and the dry air source 120 to the mixer 130. The dry air supplied to the mixer 130 is introduced into the dry air flow passage 136 through the dry air supply tube 162. At the same time, the liquefied gas, supplied from the liquefied gas source 110 via the liquefied gas supply tube 161 passes the liquefied gas distribution header 131 of the mixer, is subjected to flow rate control at the solenoid valves 132, and is supplied to the liquefied gas guide tube 133, where, if the atomizing member 139 is fitted on the liquefied gas guide tube 133, liquid phase grains of the liquefied gas are atomized into fine particles as the liquefied gas passes through pass through holes 139b, and is guided toward the liquefied gas outlet 138.

As the end of the liquefied gas guide tube 133 is positioned in the dry air flow passage 136, the end of the liquefied gas guide tube 133 acts as an obstacle against the dry air flow, such that the dry air forms stream lines around the liquefied gas guide tube 133 and a low pressure region A is formed in the vicinity of the back side of the liquefied gas guide tube 133, i.e., in the vicinity of the liquefied gas outlet 138, having a low pressure. The atomized liquefied gas supplied to the liquefied gas guide tube 133 flows through the liquefied gas outlet smoothly and is mixed with the dry air due to the pressure difference in the lower pressure region A.

In another words, if the low pressure region is not formed at an outer side of the liquefied gas outlet 138, the supply of the liquefied gas can not smoothly flow due to the pressure of the dry air, which hinders uniform mixing of the cooling fluid. However, since the liquefied gas outlet 138 is formed at the back side of the liquefied gas guide tube 133 in the dry air flow direction, the low pressure region A is formed in the vicinity of the outlet 138, permitting smooth discharge of the relatively high pressure liquefied gas through the liquefied gas outlet 138 and mixing with the dry air.

Eventually, the liquefied gas and the dry air mixed in the dry air flow passage 136 are supplied to the filter assembly 140 through the cooling fluid supply tube 163 connected to the outlet of the dry air flow passage 136. In this case, if the atomizing member 239 is fitted to the outlet of the dry air flow passage 136, the cooling fluid flowing through the dry air flow passage 136 is atomized as it passes through the net 239a of the atomizing member 239, before being supplied to the filter assembly 140.

The cooling fluid discharged from the mixer 130 flows through the cooling fluid supply tube 163, and is introduced into the housing 141 through the inlet 142 to the filter assembly 140. In the filter assembly 140, gas and very fine liquid gas particles, which are lightest in the cooling fluid are directly discharged to the cooling fluid supply tube 164 through the outlet 143, which is a low pressure region, without reaching the gas-liquid separating member 144, as the gas and very fine liquid particles of the liquefied gas have low kinetic energy. However, the liquid phase of the liquefied gas, with a large grain size, come into contact with the gas-liquid separating member 144 and flow down, as the liquefied gas has a high kinetic energy.

The liquid phase of the liquefied gas, which flows down along the gas-liquid separating member 144, is collected in a collecting part 146, vaporized slowly, and is then discharged to the cooling fluid supply tube 164 through the outlet 143. Accordingly, most of the cooling fluid discharged to the cooling fluid supply tube 164 through the filter assembly 140 is gaseous liquefied gas and dry air, and even if a liquid phase of the liquefied gas is contained therein, the particle size is very fine.

The cooling fluid of liquefied gas and dry air discharged in fine particles through the filter assembly 140 is sprayed through the nozzle assembly 170 toward the semiconductor device(s) S being tested, and cools down the semiconductor device(s) S.

During testing, while the semiconductor device(s) are cooled down by the heat sink(s) 180 and the nozzle assembly 170, the temperature sensor(s) 181 in the heat sink(s) 180 detect the temperature and transmits the detected temperature to the control unit 190. The control unit 190 calculates a temperature of the semiconductor device(s) according to a given experimental equation from the temperature transmitted from the temperature senor 181, and provides a control signal to the first solenoid valve 150 and the second solenoid valve 155.

The first solenoid valve 150 and the second solenoid valve 155, which are controlled by the control signal from the control unit 190, control a flow rate of the cooling fluid sprayed from the nozzle assembly 170 by controlling flow rates of the liquefied gas and the dry air supplied to the mixer 130, thereby maintaining the test temperature of the semiconductor device(s) at an appropriate level. In the meantime, though the dry air flow passage 136, connected to the dry air source 120, is built into the mixer body 134 in the foregoing embodiment, alternatively, an exposed dry air guide pipe (not shown) may be provided for flow of the dry air without a case like the mixer body, with the end of the liquefied gas guide tube having the liquefied gas outlet formed therein inserted therein.

Figure 11:
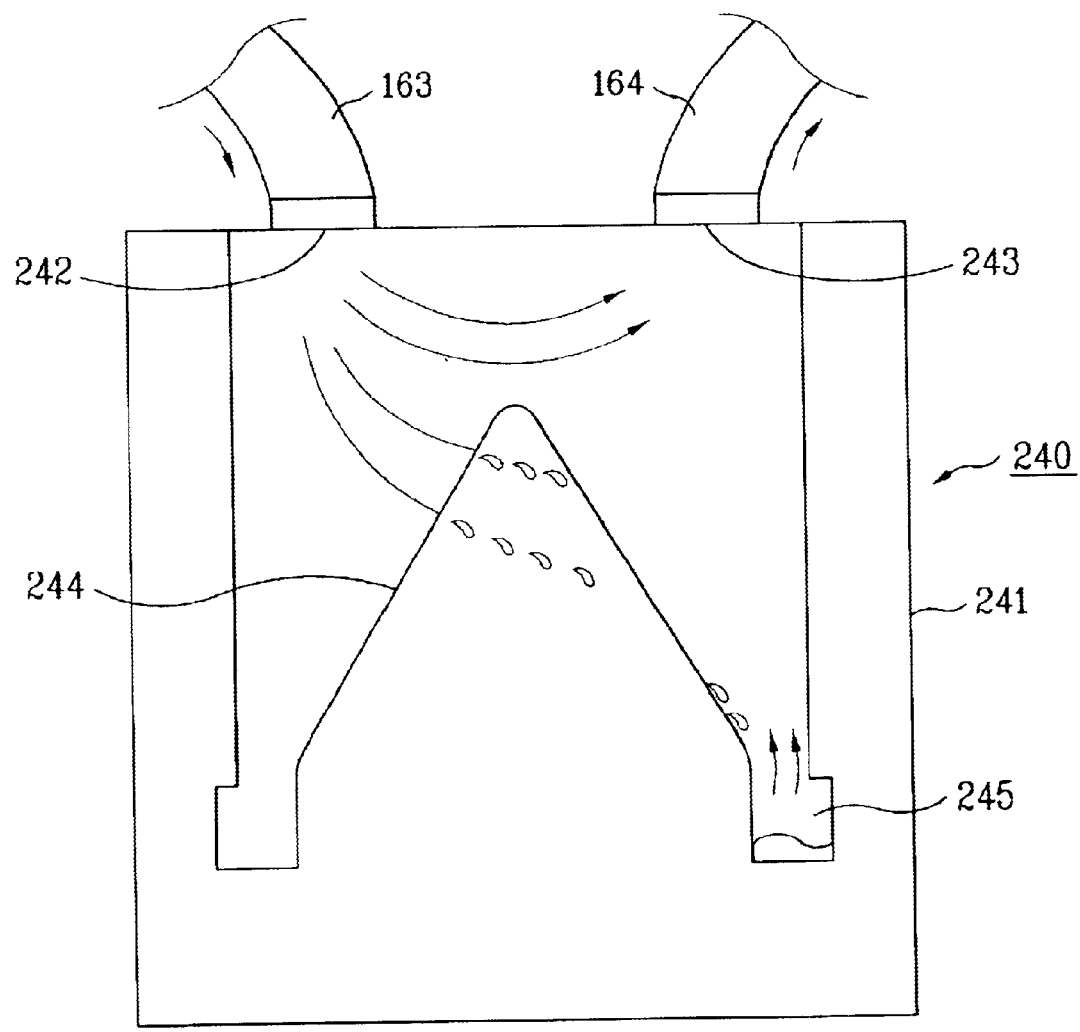
FIG. 11 is a schematic sectional view of a filter assembly in a device for compensating for a test temperature deviation in accordance with another embodiment of the invention.
Figure 12:
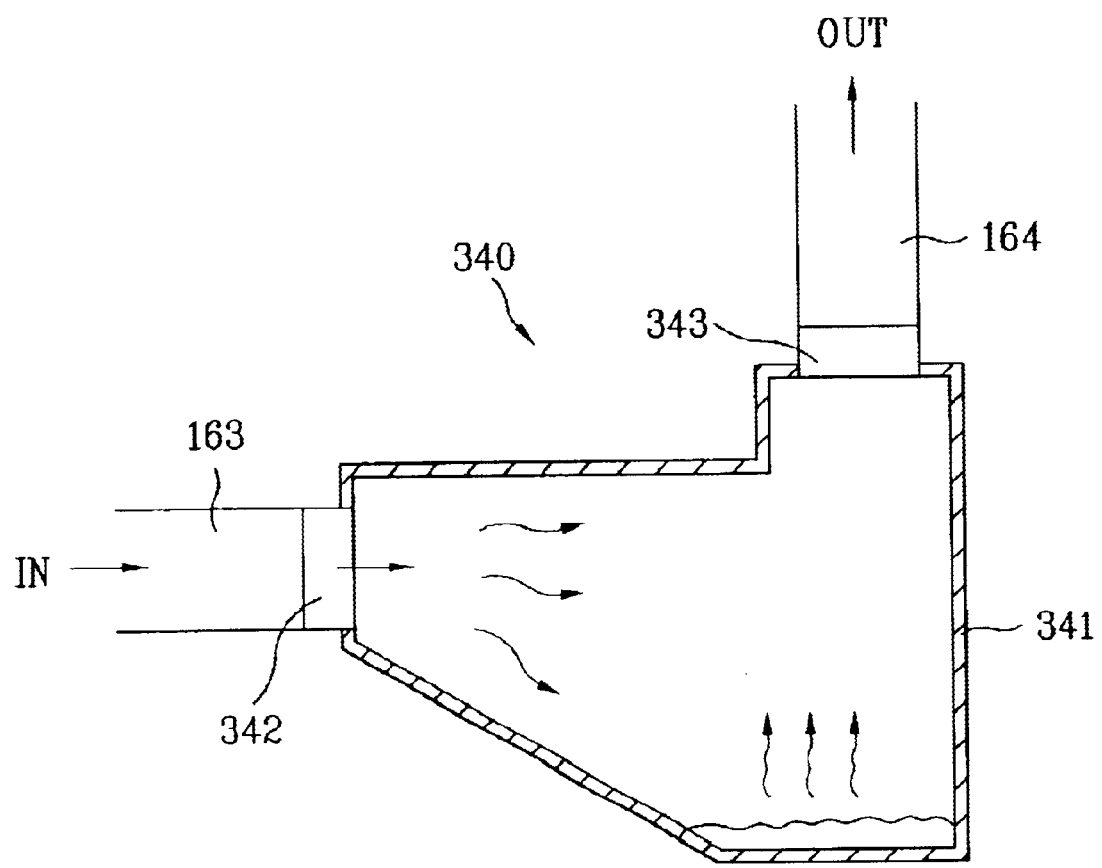
FIG. 12 is a schematic sectional view of a filter assembly in a device for compensating for a test temperature deviation in accordance with another embodiment of the invention.

FIGS. 11 and 12 illustrate another embodiment of the filter assembly. The filter assembly 240 in FIG. 11 has a bottom of the conical gas-liquid separating member 224 unified with a floor of the housing 241, and a collecting part 245 in a form of a groove in the floor of the housing 241 on an outer side of a lower portion of the gas-liquid separating part 244 for collecting liquefied gas.

Accordingly, like the foregoing filter assembly 140 of the cooling fluid introduced into the housing 241 through the inlet 242, light gaseous cooling fluid is discharged to the cooling fluid supply tube 164 through the outlet 243. On the other hand, relatively heavier liquid phase of liquefied gas flows down along an outside surface of the gas-liquid separating member 244, and is collected in the collecting part 245, vaporized, and discharged to the cooling fluid supply tube 164 through the outlet 243.

The filter assembly 340 of the embodiment illustrated in FIG. 12 includes a housing 341 having on one side an inlet 342 connected to the cooling fluid supply tube 163 for introducing the cooling fluid thereto, and a top portion of the other side having an outlet 343 connected to the cooling fluid supply tube 164 for discharging the cooling fluid. The housing 341 is in the form of a diffuser enlarged from the inlet side 342 to the outlet side 343.

When the cooling fluid of mixed dry air and liquefied gas are discharged into the housing 341 through the inlet 342, fine particles of the liquid phase of the liquefied gas is vaporized as the discharged cooling fluid expands, and is then discharged through the outlet 343 together with the dry air directly. The liquid phase of liquefied gas which is not vaporized due to a large grain size is collected in a lower part of the housing 341, vaporized as time passes, and is then discharged through the outlet in the upper side.

The filter assembly 140, 240, or 340 filters liquid phase of liquefied gas while not interfering with flow of the cooling fluid supplied to the nozzle assembly 170, and thus does not increase a pressure inside the tube and maintains a fixed pressure, permitting discharge of gaseous cooling fluid through the nozzle assembly 170 at a fixed pressure.

As will be evident to those of ordinary skill in the art, the device for compensating a test temperature deviation in a handler, in which a temperature rise caused by heat generation at the semiconductor device itself is suppressed, all tests to be carried out at a user desired exact temperature or within a user desired exact temperature range.

Thus, the device for compensating for a test temperature deviation in a semiconductor device handler according to the invention suppresses heat generation by the semiconductor device itself during testing, and allows testing in a desired temperature range resulting in improved test reliability and yield, because cooling fluid of the liquefied gas and the dry air is supplied to the semiconductor device and a heat sink comes into surface to surface contact with the semiconductor device during the semiconductor test, for cooling the semiconductor device.

The foregoing embodiments and advantages are merely exemplary and are not to be construed as limiting the invention. The present teaching can be readily applied to other types of apparatuses. The description of the invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor device handler, comprising:
   at least one enclosed chamber;
   a heating/cooling apparatus configured to bring an inside of the at least one chamber to a low or high temperature state;
   a pushing unit provided within the at least one chamber and configured to push a plurality of semiconductor devices mounted on a test tray into test sockets of a test board located within the at least one chamber for testing;
   a cooling fluid supplying apparatus configured to supply cooling fluid;
   a nozzle assembly configured to spray cooling fluid received from the cooling fluid supplying apparatus onto the semiconductor devices fitted to the test sockets; and
   a control unit configured to control spraying of cooling fluid onto the semiconductor devices during testing to compensate for temperature changes of the semiconductor devices that occur during testing.

2. The semiconductor device handler as claimed in claim 1, wherein the cooling fluid supplying apparatus comprises:
   a liquefied gas source;
   a dry air source; and
   a mixer configured to mix liquefied gas received from the liquefied gas source and dry air received from the dry air source to produce a cooling fluid.

3. The semiconductor device handler as claimed in claim 2, further comprising a plurality of heat sinks mounted on the test tray and configured to be brought into contact with respective surfaces of the semiconductor devices to cool the semiconductor devices.

4. The semiconductor device handler as claimed in claim 3, wherein the heat sink includes a heat pipe fitted thereto filled with refrigerant.

5. The semiconductor device handler as claimed in claim 2, wherein the cooling fluid supply apparatus further comprises:

a first control valve on a flow line connecting the liquefied gas source and the mixer configured to control a flow of the liquefied gas supplied from the liquefied gas source to the mixer; and a second control valve on a flow line connecting the dry air source and the mixer configured to control a flow of the dry air supplied to the mixer, wherein the first control valve and the second control valve are electrically controlled by the control unit.

6. The semiconductor device handler as claimed in claim 5, wherein the control unit is configured to control a time period during which the cooling fluid is sprayed onto the semiconductor devices.

7. The semiconductor device handler as claimed in claim 5, wherein the control unit is configured to control the proportions of the gases that comprise the cooling fluid.

8. The semiconductor device handler as claimed in claim 5, wherein the control unit is configured to control the flow rate of the cooling fluid.

9. The semiconductor device handler as claimed in claim 5, wherein the control unit is configured to receive at least one temperature signal from at least one external temperature sensor, and wherein the control unit uses the at least one temperature signal to control spraying of cooling fluid.

10. The semiconductor device handler as claimed in claim 2, further comprising a filter assembly on a flow line connecting the mixer and the nozzle assembly configured to atomize a liquid phase of the liquefied gas in the cooling fluid of the dry air and discharged from the mixer.

11. The semiconductor device handler as claimed in claim 10, wherein the filter assembly comprises:

a housing having an inlet in a top surface thereof connected to a first portion of a cooling fluid supply line in communication with the mixer and an outlet in the top surface thereof connected to a second portion of the cooling fluid supply line in communication with the nozzle assembly;

a gas-liquid separating member in the housing configured to separate from the cooling fluid contact with liquefied gas remaining in a liquid phase; and a collecting part in a lower part of the housing configured to collect liquefied gas remaining in the liquid phase which flows down along a gas-liquid separating member.

12. The semiconductor device handler as claimed in claim 11, wherein the gas-liquid separating member is conical.

13. The semiconductor device handler as claimed in claim 11, wherein the gas-liquid separating member is formed on a vertical support on a floor of the housing, and the collecting part is formed in a space between a bottom of the gas-liquid separating member and the floor of the housing.

14. The semiconductor device handler as claimed in claim 11, wherein the gas-liquid separating member is formed as a unit with the floor of the housing, and the collecting part is formed in a form of a groove at the floor of the housing on an outer side of a lower part of the gas-liquid separating member.

15. The semiconductor device handler as claimed in claim 10, wherein the filter assembly comprises:

a housing in the form of a diffuser with a section enlarged as it extends from an inlet to an outlet;

an inlet in one side of the housing configured to be connected to a first portion of the cooling fluid flow line in communication with the mixer; and an outlet in a top part of an opposite side of the inlet configured to be connected to a second portion of the cooling fluid flow line in communication with the nozzle assembly.

16. The semiconductor device handler as claimed in claim 2, wherein the mixer comprises:

a body;

at least one dry air flow passage in the body for flow of the dry air;

at least one liquefied gas guide tube fitted to one side of the body and configured to penetrate one side of the dry air flow passage perpendicular to the one side such that an end thereof is positioned inside the dry air flow passage; and a liquefied gas outlet in a back side of the end with reference to a flow direction of the dry air, for discharging the liquefied gas.

17. The semiconductor device handler as claimed in claim 16, wherein the mixer further includes;

a liquefied gas distribution header connected to the liquefied gas source; and a control valve configured to control supply of the liquefied gas from the liquefied gas header to the liquefied gas guide tubes.

18. The semiconductor device handler as claimed in claim 16, wherein the mixer further comprises an atomizing member in the liquefied gas guide tube configured to atomize liquid phase grains as the liquefied gas supplied to the dry air flow passage passes therethrough.

19. The semiconductor device handler as claimed in claim 18, wherein the atomizing member is a perforated plate.

20. The semiconductor device handler as claimed in claim 18, wherein the atomizing member is a net.

21. The semiconductor device handler as claimed in claim 16, wherein the mixer further comprises an atomizing member at an outlet of the dry air guide tube configured to atomize a liquid phase of the liquefied gas as the mixed fluid of the liquefied gas and the dry air passes therethrough.

22. The semiconductor device handler as claimed in claim 21, wherein the atomizing member is a perforated plate.

23. The semiconductor device handler as claimed in claim 21, wherein the atomizing member is a net.

24. The semiconductor device handler as claimed in claim 2, wherein the liquefied gas source comprises a liquefied nitrogen source.

25. The semiconductor device handler as claimed in claim 1, further comprising at least one temperature sensor configured to detect a temperature and transmit the measured temperature to the control unit to control spraying of cooling fluid.

26. The semiconductor device handler as claimed in claim 25, wherein the temperature sensor is located in the pushing unit.

27. The semiconductor device handler as claimed in claim 26, wherein the at least one external temperature sensor is located in the test board.

28. The semiconductor device handler as claimed in claim 1, wherein the nozzle assembly is attached to the pushing unit.

* * * * *

UNITED STATES PATENT AND TRADEMARK OFFICE
CERTIFICATE OF CORRECTION

PATENT NO. : 6,861,861 B2
DATED : March 1, 2005
INVENTOR(S) : Jae Myeong Song et al.

It is certified that error appears in the above-identified patent and that said Letters Patent is hereby corrected as shown below:

Title page,
Item [73], Assignee, should read:
-- [73] Assignee: Mirae Corporation, Seoul (KR) --

Signed and Sealed this

Twenty-fourth Day of May, 2005

JON W. DUDAS
*Director of the United States Patent and Trademark Office*